US006762656B1

United States Patent
Kobayashi et al.

(10) Patent No.: US 6,762,656 B1
(45) Date of Patent: Jul. 13, 2004

(54) LC NOISE FILTER

(75) Inventors: Hirofumi Kobayashi, Fukui-ken (JP); Shigekatsu Yamamoto, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/633,580

(22) Filed: Aug. 7, 2000

(30) Foreign Application Priority Data

Aug. 6, 1999 (JP) .......................................... 11-224487

(51) Int. Cl.[7] .............................................. H03H 7/00
(52) U.S. Cl. ........................ 333/184; 333/175; 333/185
(58) Field of Search ................................ 333/175, 184, 333/185

(56) References Cited

U.S. PATENT DOCUMENTS

| 5,029,043 A | * | 7/1991 | Kitahara et al. ........ 333/185 X |
| 5,051,712 A | * | 9/1991 | Naito et al. ................. 333/185 |
| 5,278,526 A | | 1/1994 | Ikeda ......................... 333/185 |
| 5,777,533 A | | 7/1998 | Kato et al. .................. 333/185 |

FOREIGN PATENT DOCUMENTS

| JP | 62-96826 | | 6/1987 |
| JP | 02-224512 | * | 9/1990 |
| JP | 6-163321 | | 6/1994 |
| JP | 6-188148 | | 7/1994 |
| JP | 9-214273 | | 8/1997 |

* cited by examiner

Primary Examiner—Robert Pascal
Assistant Examiner—Kimberly E Glenn
(74) Attorney, Agent, or Firm—Keating & Bennett, LLP

(57) ABSTRACT

An LC noise filter includes a capacitor unit having a plurality of capacitor electrode patterns and a plurality of insulating layers that are stacked and integrated, and an inductor unit in which a plurality of coil conductor patterns and a plurality of insulating layers are stacked and integrated. In the LC noise filter, the inductor unit and the capacitor unit are stacked, and a cutoff frequency is adjusted in accordance with the distance in the stacked direction between the coil conductor pattern and the capacitor electrode pattern being next to each other in the stacked direction.

13 Claims, 3 Drawing Sheets

LC NOISE FILTER

BACKGROUND OF THE INVENTION

1. Field of the Invention

The present invention relates to LC noise filters, and more particularly relates to a laminated LC noise filter used for a high-frequency electronic circuit, a high-frequency signal transmission line, or other suitable devices.

2. Description of the Related Art

Conventional laminated LC noise filters include a capacitor portion having a layered arrangement of a plurality of insulating sheets provided with a capacitor electrode pattern on the surface thereof, and an inductor portion having a layered arrangement of insulating sheets provided with an inductor electrode pattern on the surface thereof. The capacitor portion and the inductor portion are layered and integrated. When these laminated LC noise filters are offered as products to users, they must be configured to have various cutoff frequencies $f_c$ in accordance with the needs of the users.

The cutoff frequency $f_c$ of the LC noise filter is determined by the inductance of the inductor and the capacitance of the capacitor, which are incorporated in the LC noise filter. Accordingly, in the conventional LC noise filter, to change the cutoff frequency, the inductance is changed by changing the number of the layered coil conductor patterns within the inductor. However, when the number of the layered coil conductor patterns is changed, the inductance of the layered coil conductor patterns is changed in specific increments, which consequently only allows the cutoff frequency $f_c$ to be set at these specific increments.

When it is necessary to precisely control the cutoff frequency $f_c$, the inductance is changed by changing the shapes of the coil conductor pattern, or changing the magnetic permeability of the insulating sheet or the thickness thereof, whereby the cutoff frequency $f_c$ is precisely controlled. Alternatively, a desired cut-off frequency $f_c$ is obtained by changing the capacitance of the capacitor by changing the size of the area of the capacitor electrode patterns while the inductance is maintained constant.

However, the change of the shape of the coil conductor pattern, the change of the magnetic permeability of the insulating sheet, or the change of the thickness thereof requires a complicated and costly printing process to produce the coil conductor pattern or a complicated and costly manufacturing process to produce the insulating sheet. In addition, when the capacitance is changed while the inductance is maintained constant, the shape factor (the gradient of the insertion loss versus frequency characteristic) which pertains to the capability of separating signals from noise deteriorates. Furthermore, when the LC noise filter is used in high frequency ranges, the filter must have a small deviation in the cutoff frequency, which the conventional filter cannot achieve.

SUMMARY OF THE INVENTION

To overcome the above-noted problems with the prior art, preferred embodiments of the present invention provide an LC noise filter in which a desired cutoff frequency is easily and accurately achieved.

Preferred embodiments of the present invention provide an LC noise filter including a capacitor unit having a plurality of capacitor electrode patterns and a plurality of insulating layers that are stacked and integrated, and an inductor unit having a plurality of coil conductor patterns and a plurality of insulating layers that are stacked and integrated. In the LC noise filter, the inductor unit and the capacitor unit are stacked, and the cutoff frequency $f_c$ is adjusted in accordance with the distance d in the stacked direction between the coil conductor pattern and the capacitor electrode pattern that are next to each other in the stacked direction.

Since the capacitor electrode pattern is arranged in the vicinity of the inductor unit, eddy current loss is produced in the capacitor electrode pattern by the magnetic flux generated in the inductor unit. The eddy current loss changes according to the distance d in the stacked direction between the coil conductor pattern of the inductor unit and the capacitor electrode pattern in the capacitor unit that are arranged adjacent to each other in the stacked direction. The eddy current loss increases as the distance d decreases. When the eddy current loss increases, the inductance value of the inductor decreases. Therefore, adjusting the distance d causes the eddy current loss to be altered, and the inductance value is finely controlled to have a desired value.

Since the inductance of the inductor unit is finely controlled in accordance with the distance in the stacked direction between the coil conductor pattern and the capacitor electrode pattern which are next to each other, the desired cutoff frequency $f_c$ is obtained without using a complicated and costly manufacturing process or increasing materials for the insulating sheets. Therefore, an inexpensive LC noise filter is obtained having the desired cutoff frequency. Moreover, this LC noise filter produces minimal variations and deviations in the characteristic of the LC noise filter.

In the LC noise filter, the distance between the coil conductor pattern and the capacitor electrode pattern which are next to each other in the stacked direction, are preferably in the range of about 80 $\mu$m to about 300 $\mu$m. This enables the cutoff frequency to be effectively and accurately set.

In the LC noise filter, the distance in the stacked direction between the adjacent coil conductor patterns in the inductor unit is at least about 2.5 times as long as the distance in the stacked direction between the adjacent capacitor electrode patterns in the capacitor unit. With this configuration, the distance between mutually adjacent coil conductor patterns in the inductor unit increases and suppresses stray capacitance occurring among the coil conductor patterns.

In the LC noise filter, the relative dielectric constant E of the insulating layer is preferably in the range from about 50 to about 100. This prevents adverse influence of stray capacitance occurring across the input and output of the inductor, as well as enabling the capacitance of the capacitor to have a desired value.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
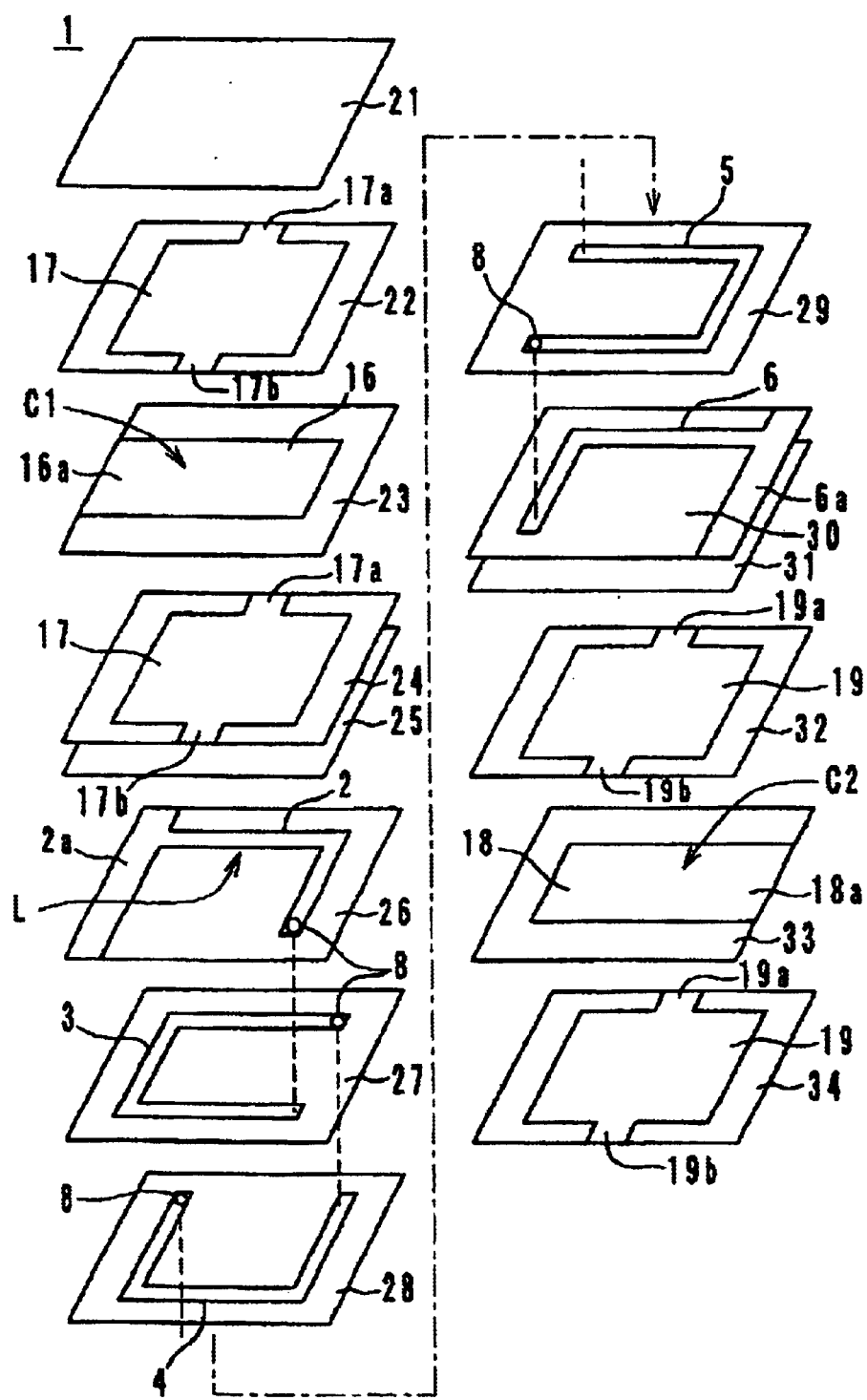
FIG. 1 is an exploded perspective view of a preferred embodiment of an LC noise filter according to the present invention.

As shown in FIG. 1, a laminated LC noise filter 1 includes insulating sheets 26, 27, 28, 29, and 30 having coil conductor patterns 2, 3, 4, 5, and 6, respectively, provided on the surfaces thereof; insulating sheets 23 and 33 having hot-side capacitor electrode patterns 16 and 18, respectively, provided on the surfaces thereof; insulating sheets 22, 24, 32, and 34 having ground-side capacitor electrode patterns 17, 17, 19, and 19, respectively, provided on the surfaces thereof; insulating sheets 25 and 31 for thickness-adjusting; and a protective insulating sheet 21.

The coil conductor patterns 2 to 6, which are provided on the insulating sheets 26 to 30, respectively, are electrically connected in series through via holes 8 provided in each of the insulating sheets 26 to 29, thereby defining a coiled inductor L. A lead-in part 2a of the coil conductor pattern 2 provided on the insulating sheet 26 is exposed at the left periphery thereof, and a lead-in part 6a of the coil conductor pattern 6 provided in the insulating sheet 30 is exposed at the right periphery thereof, whereby the insulating sheets 26 to 30 define an inductor unit.

A lead-in part 16a of the hot-side capacitor electrode pattern 16 provided on the insulating sheet 23 is exposed at the left periphery thereof. Lead-in parts 17a of the ground-side capacitor electrode patterns 17 provided on each of the insulating sheets 22 and 24 are exposed at the rear-side (when viewed in FIG. 1) peripheries thereof, and lead-in parts 17b are exposed at the front-side (when viewed in FIG. 1) peripheries thereof. The insulating sheets 22 to 24 define a capacitor unit such that a capacitor C1 is defined between the hot-side capacitor electrode pattern 16 and the ground-side capacitor electrode patterns 17.

A lead-in part 18a of the hot-side capacitor electrode pattern 18 provided on the insulating sheet 33 is exposed at the right periphery thereof. Lead-in parts 19a of the ground-side capacitor electrode patterns 19 provided on each of the insulating sheets 32 and 34 are exposed at the rear-side peripheries thereof, and lead-in parts 19b are exposed at the front-side peripheries thereof. The insulating sheets 32 to 34 define a capacitor unit, such that a capacitor C2 is defined between the hot-side capacitor electrode pattern 18 and the ground-side capacitor electrode patterns 19.

As materials of the insulating sheets 21 to 34, magnetic materials, dielectric materials, and other suitable materials are used. The relative dielectric constant $\epsilon$ of each of the insulating sheets 21 to 34 preferably satisfies $\epsilon \leq 100$, and more preferably $50 \leq \epsilon \leq 100$. When the relative dielectric constant $\epsilon$ is greater than about 100, high-frequency characteristics with respect to insertion loss are worsened due to the influence of stray capacitance occurring across the input and the output of the inductor L.

When the relative dielectric constant $\epsilon$ is less than about 50, the capacitors C1 and C2 do not have the required capacitances. Therefore, the relative dielectric constant $\epsilon$ preferably satisfies the relationship: $50 \leq \epsilon \leq 100$. As materials of the coil conductor patterns 2 to 6 and the capacitor electrode patterns 16 to 19, Ag—Pd, Ag, Ni, Cu and other suitable materials are preferably used.

Figure 2:
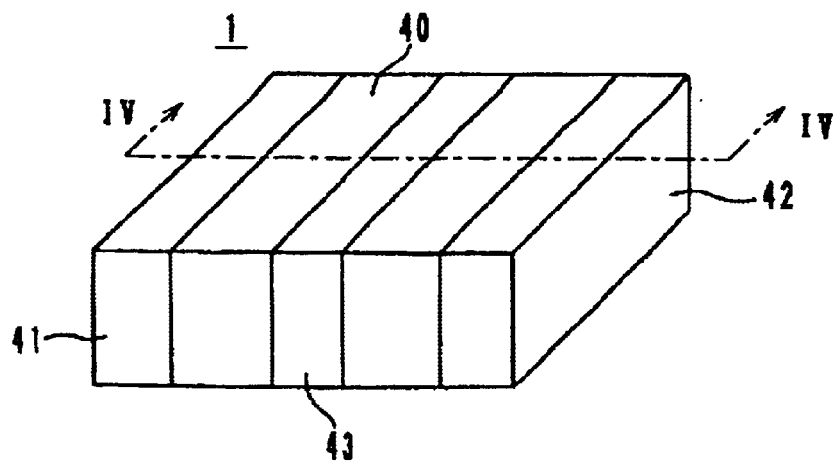
FIG. 2 is a perspective view showing the appearance of the LC noise filter in FIG. 1.
Figure 3:
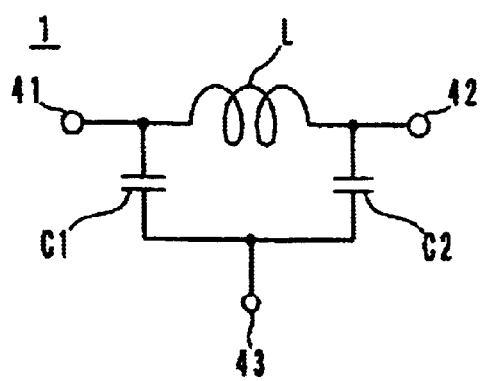
FIG. 3 is a circuit diagram showing an equivalent circuit of the LC noise filter in FIG. 1.

These insulating sheets 21 to 34 are stacked and uniformly sintered, whereby the LC noise filter 1 having a stacked body 40 (see FIG. 2) is produced. An input electrode 41 and an output electrode 42 are provided on the corresponding ends of the LC noise filter 1, and a ground electrode 43 is provided on the approximate central part thereof. The input electrode 41 is electrically connected to the lead-in part 2a of the coil conductor pattern 2 and to the lead-in part 16a of the capacitor electrode pattern 16. The output electrode 42 is electrically connected to the lead-in part 6a of the coil conductor pattern 6 and to the lead-in part 18a of the capacitor electrode pattern 18. The ground electrode 43 is electrically connected to the lead-in parts 17a, 17b, 19a, and 19b of the corresponding capacitor electrode patterns 17 and 19. FIG. 3 shows an equivalent circuit of the LC noise filter 1, in which a π-LC circuit is provided.

Figure 4:
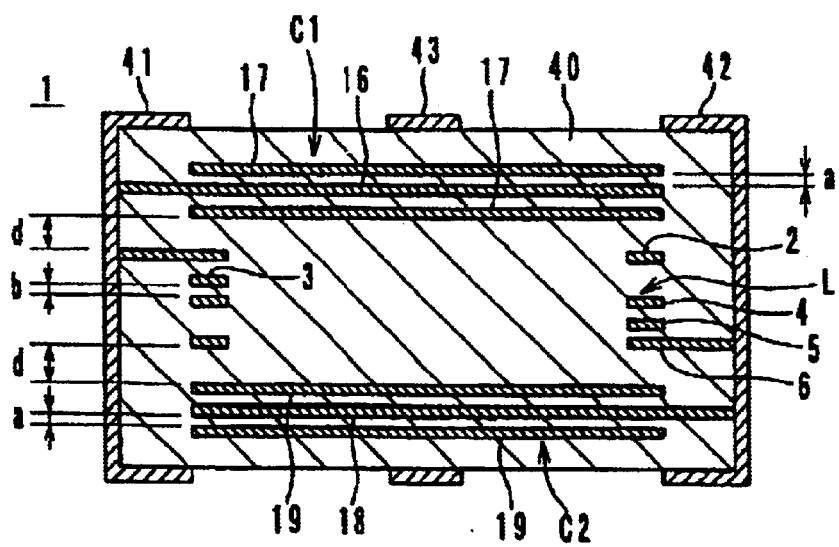
FIG. 4 is a cross-sectional view taken along line IV—IV in FIG. 2.

In the LC noise filter 1 having the above-described construction, the number of the stacked coil conductor patterns in the inductor L is changed, which causes inductance to be changed only in specific increments, whereby the cutoff frequency $f_c$ is able to be changed only in these specific increments. In order to finely control the cutoff frequency $f_c$, as shown in FIG. 4, the distance d in the stacked direction of the insulating sheets 21 to 34 between the coil conductor pattern 2 of the inductor L and the capacitor electrode pattern 17 of the capacitor C1 which are arranged adjacent to each other in the stacked direction, and the distance d in the stacked direction of the insulating sheets 21 to 34 between the coil conductor pattern 6 of the inductor L and the capacitor electrode pattern 19 of the capacitor C2 which are arranged adjacent to each other in the stacked direction are appropriately set. Specifically, the distance d is changed by changing the thickness of each of the thickness-adjusting insulating sheets 25 and 31 or by changing the number of each of the insulating sheets 25 and 31.

Since the capacitor electrode patterns 17 and 19 having wider areas are provided in the proximity of the inductor L, eddy current loss occurs at each of the capacitor electrode patterns 17 and 19 due to magnetic flux generated at the inductor L. The eddy current loss changes in accordance with the distance d. For example, as the distance d decreases, the eddy current loss increases. When the eddy current loss increases, the inductance of the inductor L decreases. Accordingly, the eddy current loss changes in accordance with adjustment of the distance d, which enables the inductance of the inductor L to be finely controlled. Therefore, the cutoff frequency $f_c$ can be set to any desired value.

Figure 5:
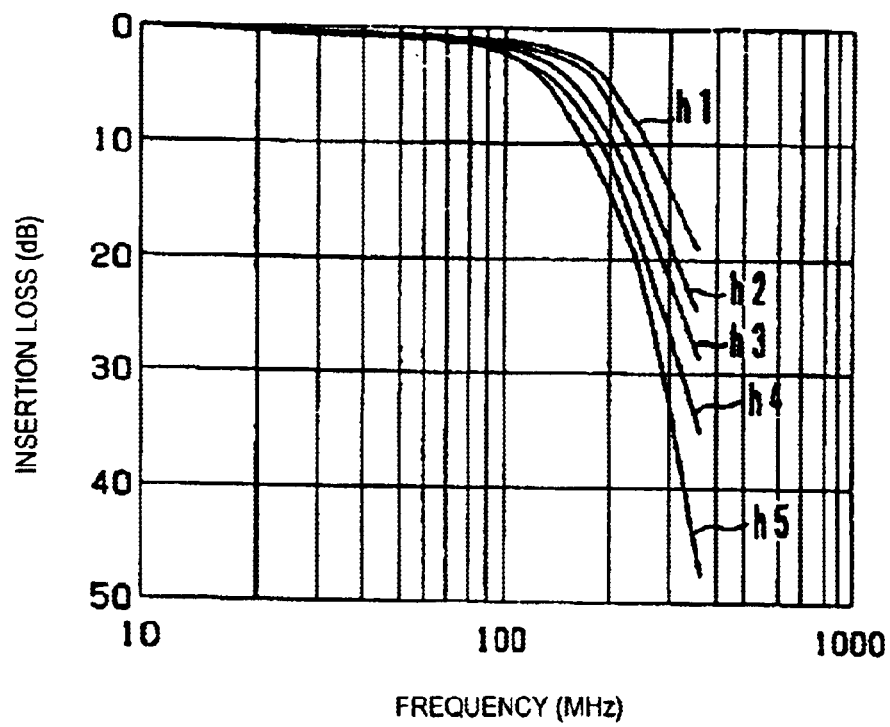
FIG. 5 is a graph showing insertion loss characteristics of the LC noise filter having the construction shown in FIG. 1.

In this preferred embodiment of the present invention, the distance d is preferably selected to be in the range about 80 µm to about 300 µm, whereby the inductance of the inductor L is finely controlled. When the distance d is less than about 80 µm, the adverse influence of stray capacitance among the inductor L and the capacitors C1 and C2 increases. This causes the equivalent circuit (the π-LC circuit) of the LC noise filter 1 shown in FIG. 3 to be changed into a different circuit configuration. This makes it difficult to obtain the desired insertion-loss characteristics. FIG. 5 shows that the cutoff frequency $f_c$ of the LC noise filter 1 having the configuration shown in FIGS. 1 and 2 varies in accordance with the distance d. In FIG. 5, curves h1, h2, h3, h4, and h5 show cutoff-frequency characteristics where d is 28 µm, 56 µm, 96 µm, 148 µm, and 168 µm, respectively. Further, when the distance d is greater than about 300 µm, since the eddy current loss occurring in the capacitor electrode patterns 17 and 19 decreases, it is difficult to change the inductance of the inductor L. This makes it difficult to finely control the cutoff frequency $f_c$.

In this preferred embodiment of the present invention, the distance b in the stacked direction between the adjacent coil conductor patterns 2 to 6, which have the corresponding insulating sheets 26 to 29 therebetween, is preferably at least about 2.5 times as long as the distance a in the stacked direction between the adjacent capacitor electrode patterns 16 to 19, which have the corresponding insulating sheets 22, 23, 32, and 33 therebetween. Accordingly, as the distance between the adjacent coil conductor patterns 2 to 6 increases, the occurrence of stray capacitance therebetween is prevented.

The present invention is not limited to the foregoing preferred embodiments. Various forms of construction may be used without departing from the spirit and scope of the present invention. Although the equivalent circuit of the LC noise filter is the π-LC circuit in the foregoing preferred embodiment, the equivalent circuit of the LC noise filter may be a T-LC circuit including two inductor units and one capacitor unit, or an L-LC circuit including one inductor unit and one capacitor unit.

Although, in the foregoing embodiment, the LC noise filter is constructed in which insulating sheets having the coil conductor pattern or the capacitor electrode pattern provided thereon are stacked and uniformly sintered, the construction of the LC noise filter is not necessarily limited to this. The insulating sheets may be pre-sintered. Alternatively, the LC noise filter may be constructed as follows. An insulating layer is provided by means of printing or other suitable process using an insulating material paste; the coil conductor pattern or the capacitor electrode pattern is provided by coating conductive material paste onto the surface of the insulating layer; the insulating layer having the coil conductor pattern incorporated therein is obtained by coating the insulating material paste onto the coil conductor pattern; and finally, the LC noise filter having a stacked construction is obtained by successively coating in the same manner as described above.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An LC noise filter having a cutoff frequency comprising:
   at least two capacitor units including a hot-side capacitor pattern, ground-side capacitor patterns and a plurality of insulating layers which are stacked and integrated; and
   an inductor unit including a plurality of coil conductor patterns and a plurality of insulating layers which are stacked and integrated; wherein
   said at least two capacitor units are stacked above and below said inductor unit in a stacking direction;
   the hot-side capacitor pattern is arranged between the ground-side capacitor patterns;
   one of said plurality of coil conductor patterns is arranged adjacent to one of the ground-side capacitor patterns in the stacking direction with a distance d between said one of said plurality of coil conductor patterns and said one of the ground-side capacitor patterns; and
   the cutoff frequency is determined by the distance d; wherein
   the relative dielectric constant of the plurality of insulating layers is between about 50 and about 100; and
   the area of the ground-side capacitor pattern arranged adjacent to the inductor unit is larger than the area of the plurality of coil conductor patterns.

2. An LC noise filter according to claim 1, wherein the distance d is between about 80 µm and about 300 µm.

3. An LC noise filter according to claim 1, wherein the distance d in the stacked direction between adjacent coil conductor patterns in said inductor unit is at least about 2.5 times the distance in the stacked direction between adjacent capacitor electrode patterns in said capacitor unit.

4. An LC noise filter according to claim 2, wherein the distance d in the stacked direction between adjacent coil conductor patterns in said inductor unit is at least about 2.5 times the distance in the stacked direction between adjacent capacitor electrode patterns in said capacitor unit.

5. A method of producing an LC noise filter having a cutoff frequency comprising:
   forming at least two capacitor units including a hot-side capacitor pattern, ground-side capacitor patterns and a plurality of insulating layers which are stacked and integrated;
   forming an inductor unit including a plurality of coil conductor patterns and a plurality of insulating layers which are stacked and integrated;
   arranging said at least two capacitor units above and below said inductor unit in a stacking direction;
   arranging the hot-side capacitor pattern between the ground-side capacitor patterns;
   configuring the ground-side capacitor patterns such that the area of ground-side capacitor pattern adjacent to the inductor unit is larger than the area of the plurality of coil conductor patterns;
   arranging one of said plurality of coil conductor patterns adjacent to one of the ground-side capacitor patterns in the stacking direction with a distance d between said one of said plurality of coil conductor patterns and said one of the ground-side capacitor patterns;
   adjusting the distance d to adjust the cutoff frequency of the LC noise filter; and
   setting the relative dielectric constant of the plurality of insulating layers to between about 50 and about 100.

6. A method of producing an LC noise filter according to claim 5, wherein said step of adjusting the distance d includes changing the number of insulating layers of said plurality of insulating layers of the capacitor unit.

7. A method of producing an LC noise filter according to claim 5, wherein said step of adjusting the distance d includes changing the number of insulating layers of said plurality of insulating layers of the inductor unit.

8. A method of producing an LC noise filter according to claim 5, wherein said step of adjusting the distance d includes changing the number of insulating layers of said plurality of insulating layers of both the capacitor unit and the inductor unit.

9. A method of producing an LC noise filter according to claim 5, wherein the distance d is adjusted to be between about 80 µm and about 300 µm.

10. A method of producing an LC noise filter according to claim 9, wherein the distance d in the stacked direction between adjacent coil conductor patterns in said inductor unit is adjusted to be at least about 2.5 times the distance in the stacked direction between adjacent capacitor electrode patterns in said capacitor unit.

11. A method of producing an LC noise filter according to claim 5, wherein the distance d in the stacked direction between adjacent coil conductor patterns in said inductor unit is adjusted to be at least about 2.5 times the distance in the stacked direction between adjacent capacitor electrode patterns in said capacitor unit.

12. An LC noise filter having a cutoff frequency comprising:
- at least two capacitor units including a hot-side capacitor pattern, ground-side capacitor patterns and a plurality of insulating layers which are stacked and integrated; and
- an inductor unit including a plurality of coil conductor patterns and a plurality of insulating layers which are stacked and integrated; wherein
- said at least two capacitor units are stacked above and below said inductor unit in a stacking direction;
- the hot-side capacitor pattern is arranged between the ground-side capacitor patterns;
- one of said plurality of coil conductor patterns is arranged adjacent to one of the ground-side capacitor patterns in the stacking direction with a distance d between said one of said plurality of coil conductor patterns and said one of the ground-side capacitor patterns;
- the cutoff frequency is determined by the distance d; and
- the distance d is between about 80 $\mu$m and about 300 $\mu$m; wherein
- the area of the around-side capacitor pattern adjacent the inductor unit is larger than the area of the plurality of coil conductor patterns.

13. An LC noise filter having a cutoff frequency comprising:
- at least two capacitor units including a hot-side capacitor pattern, ground-side capacitor patterns and a plurality of insulating layers which are stacked and integrated; and
- an inductor unit including a plurality of coil conductor patterns and a plurality of insulating layers which are stacked and integrated; wherein
- said at least two capacitor units are stacked above and below said inductor unit in a stacking direction;
- the hot-side capacitor pattern is arranged between the ground-side capacitor patterns;
- one of said plurality of coil conductor patterns is arranged adjacent to one of the ground-side capacitor patterns in the stacking direction with a distance d between said one of said plurality of coil conductor patterns and said one of the ground-side capacitor patterns;
- the cutoff frequency is determined by the distance d;
- the relative dielectric constant of the plurality of insulating layers is between about 50 and about 100; and
- the distance d is between about 80 $\mu$m and about 300 $\mu$m; wherein
- the area of the ground-side capacitor pattern adjacent the inductor unit is larger than the area of the plurality of coil conductor patterns.

* * * * *